US012776768B2

(12) United States Patent
Som et al.

(10) Patent No.: US 12,776,768 B2
(45) Date of Patent: Oct. 27, 2026

(54) LOW-POWER LOW-AREA DEADTIME GENERATOR

(71) Applicant: GlobalFoundries U.S. Inc., Malta, NY (US)

(72) Inventors: Indranil Som, West Bengal (IN); Vasudeva Reddy Kuppireddy, Bangalore (IN); Vaibhav Anantrai Ruparelia, Bangalore (IN)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 55 days.

(21) Appl. No.: 18/823,924

(22) Filed: Sep. 4, 2024

(65) Prior Publication Data

US 2026/0066889 A1 Mar. 5, 2026

(51) Int. Cl.

| | |
|---|---|
| ***H03K 5/151*** | (2006.01) |
| ***G06F 1/06*** | (2006.01) |
| ***H03K 5/00*** | (2006.01) |
| ***H03K 5/05*** | (2006.01) |

(52) U.S. Cl.

CPC ............ *H03K 5/1515* (2013.01); *G06F 1/06* (2013.01); *H03K 5/05* (2013.01); *H03K 2005/00058* (2013.01)

(58) Field of Classification Search

CPC .......... H03K 5/1515; H03K 5/05; G06F 1/06

See application file for complete search history.

(56) References Cited

U.S. PATENT DOCUMENTS 4,140,927 A * 2/1979 Feucht ................ H03K 5/1515 327/295
6,714,057 B2 * 3/2004 Nguyen ................ H03K 23/00 327/117
7,598,784 B2 * 10/2009 Hunter .................. H03K 5/156 327/263

(Continued)

FOREIGN PATENT DOCUMENTS

EP 0431761 B1 * 7/1997 ......... H03K 5/15006

OTHER PUBLICATIONS

Hong, SeongWha et al.; "A Novel Dead-time Generation Method of Clock generator for Resonant Power Transfer System"; Downloaded Feb. 20, 2024; IEEE Xplore; Copyright 2010 IEEE; pp. 51-54.

(Continued)

*Primary Examiner* — Thomas J. Hiltunen
*Assistant Examiner* — Khareem E Almo
(74) *Attorney, Agent, or Firm* — David Cain; Hoffman Warnick LLC

(57) ABSTRACT

A deadtime generator configured to output a pair of non-overlapping clock signals. A circuit is provide that includes an input node for receiving a clock signal; a first signal path coupled to the input node and having a first output node for outputting a first modified clock signal, wherein the first signal path includes a feedback node coupled to an input of a feedback inverter; a second signal path coupled to the input node and having a second output node for outputting a second modified clock signal, wherein second signal path includes a Low-to-High skewed inverter; and a feedback signal path coupled to second signal path and having a High-to-Low skewed inverter with an output coupled to a gate of at least one transistor, wherein an output of the at least one transistor is coupled to the feedback node.

18 Claims, 4 Drawing Sheets

(56) References Cited

U.S. PATENT DOCUMENTS 10,491,217 B2 * 11/2019 Hsu ......................... G06F 30/30

OTHER PUBLICATIONS

Zhao, April (Yang), et al.; "One-Step Digital Dead-time Correction for DC-DC Converters"; Downloaded Jun. 14, 2024; IEEE Xplore; Copyright 2010 IEEE; pp. 132-137.

Abuelnasr, Ahmed, et al.; "Self-Adjusting Deadline Generator for High-Efficiency High-Voltage Switched-Mode Power Amplifiers"; Downloaded Feb. 20, 2024; IEEE Xplore; Copyright 2020 IEEE; pp. 5.

Chen, Hsin-Chuan; "A Dead-Time Generator Based on OPA Slew Rate for Consumer Electric Applications"; 2014 ICCE-Taiwan; Copyright 2014 IEEE; pp. 137-138.

Jeon, Yong-Joon, et al.; "A High-Voltage Fast-Speed Pulse Generator With Current-Mode Dead-time control Comparator for Shoot-Through Current Suppression"; IEEE Solid-State Circuits Letters; vol. 5; 2022; Copyright 2022 IEEE; pp. 118-121.

Yu, Kai, et al.; "Design Considerations of Charge Pump for Antenna Switch Controller with SOI CMOS Technology"; IEEE Transactions on Circuits and Systems-II: Express Briefs; vol. 64; No. 3; Mar. 2017; Copyright 2016 IEEE; pp. 229-233.

* cited by examiner

LOW-POWER LOW-AREA DEADTIME GENERATOR

BACKGROUND

The present disclosure relates generally to deadtime generator circuits and, more particularly, to a tunable deadtime generator that can be implemented with low-power, low-area, and high frequency.

Deadtime generators are circuits that generate two non-overlapping clock signals from a single clock input. Non-overlapping clock signals means that the two signals will not rise and/or fall together at the same time. Such a configuration is required for any number of clock dependent components (e.g., power amplifiers, charge pumps, etc.) in which overlapping clock signals could result in an undesirable result, e.g., short circuits, leakage at an output node, etc.

SUMMARY

All aspects, examples and features mentioned below can be combined in any technically possible way.

An aspect of the disclosure provides a circuit, including: an input node coupled to receive a clock signal; a first signal path coupled to the input node and having a first output node for outputting a first modified clock signal, wherein the first signal path includes a feedback node coupled to an input of a feedback inverter; a second signal path coupled to the input node and having a second output node for outputting a second modified clock signal, wherein second signal path includes a Low-to-High skewed inverter; and a feedback signal path coupled to second signal path and having a High-to-Low skewed inverter with an output coupled to a gate of at least one transistor, wherein an output of the at least one transistor is coupled to the feedback node.

Another aspect of the disclosure provides a system, including: a clock driven component; and a deadtime generator that includes: an input node coupled to receive a clock signal; a first signal path coupled to the input node and having a first output node for outputting a first modified clock signal to the clock driven component, wherein the first signal path includes a feedback node coupled to an input of a feedback inverter; a second signal path coupled to the input node and having a second output node for outputting a second modified clock signal to the clock driven component, wherein second signal path includes a Low-to-High skewed inverter; and a feedback signal path coupled to second signal path and having a High-to-Low skewed inverter with an output coupled to a gate of at least one transistor, wherein an output of the at least one transistor is coupled to the feedback node.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
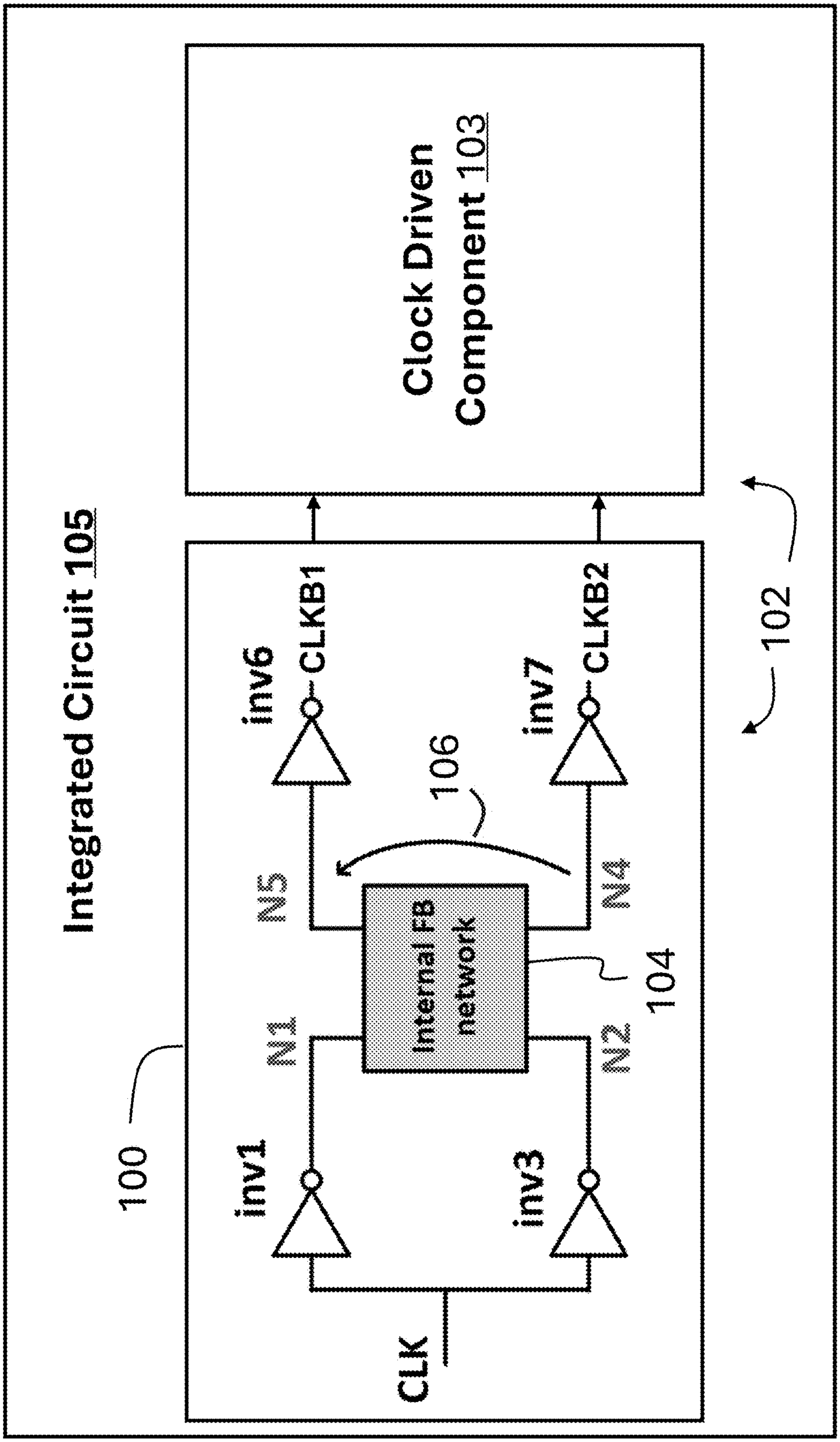
FIG. 1 shows a block diagram of a deadtime generator and associated clock driven component, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide a deadtime generator circuit (also referred to herein simply as "deadtime generator" or "circuit") that provides non-overlapping clock signals for an associated system, e.g., a power amplifier, a charge pump, etc. Conventional deadtime generators are generally implemented with logic circuits that utilize two feedback paths, each having an inverter delay chain, which creates a deadtime between the transition edges of two generated clock signals. Such an arrangement, however, has several drawbacks, including: (1) constraints on the minimum delay (i.e., deadtime) that can be achieved; and (2) the relatively large number of logic components that are required, which consume more area and power. The present approach utilizes a single feedback path and skewed inverters to achieve low deadtimes and reduced logic gates. In certain embodiments, the deadtime generator includes tunable logic that allows the deadtime value to be adjusted.

FIG. 1 shows a block diagram of a deadtime generator 100 incorporated into an integrated circuit 105. In this illustrative embodiment, deadtime generator 100 provides non-overlapping clock signals CLKB1 and CLKB2 for an associated clock driven component 103 in response to an inputted clock signal CLK. In certain embodiments, the deadtime generator 100 and component 103 together form a system 102, which may or may not be part of the integrated circuit 105. As noted, component 103 may comprise any circuit or device that requires non-overlapping clock signals to function properly. In this illustrative embodiment, deadtime generator 100 includes four identical and standard inverters inv1, inv3, inv6 and inv7 and an internal feedback (FB) network 104 that uses a single feedback loop 106.

Figure 2:
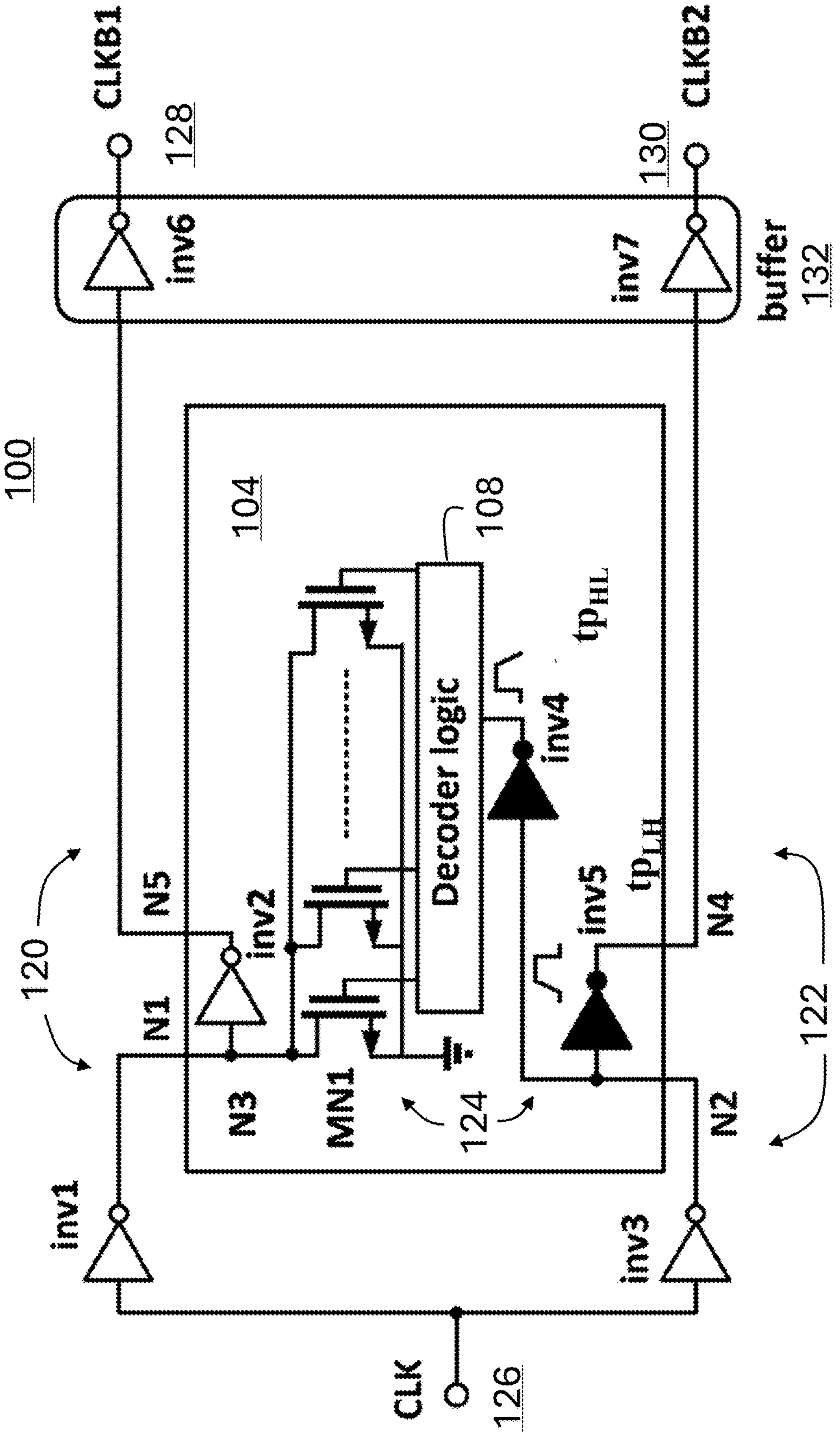
FIG. 2 shows a schematic view of a deadtime generator in further detail, according to embodiments of the disclosure.

FIG. 2 depicts a detailed schematic diagram of an illustrative deadtime generator 100 and internal feedback logic 104. Deadtime generator 100 generally includes an input node 126 for receiving a clock signal CLK, a pair of output nodes 128, 130 for outputting modified (i.e., non-overlapping) clock signals CLKB1 and CLKB2, and three signal paths 120, 122, 124. A first signal path 120 couples input node 126 with a first output node 128, and includes three inverters inv1, inv2 (also referred to herein as "feedback inverter"), and inv6. A second signal path 122 couples input node 126 with a second output node 130, and includes three inverters inv3, inv5 and inv7. Inverter inv5 is a Low-to-High skewed inverter with a transition delay of $tp_{LH}$. A third signal path, referred to herein a feedback path 124, is coupled to the second signal path 122 and includes a High-to-Low skewed inverter inv4 with a transition delay of $tp_{HL}$ that couples an output of inverter inv3 with a gate of at least one transistor MN1, which when activated, discharges a ground signal to feedback node N3. In this illustrative embodiment inverters inv6 and inv7 are utilized as buffer 132. Transistor(s) MN1 may for example comprise an N-type metal-oxide-semiconductor (NMOS) device, with its source tied to ground and its drain tied to feedback node N3.

Accordingly, internal feedback logic 104 includes two skewed inverters inv4 and inv5, a set of (i.e., one or more) NMOS transistors MN1 and decoder logic 108, which are configured to generate a required deadtime. Skewed inverter inv4 has a High-to-Low transition delay ($tp_{HL}$) and skewed inverted inv5 has a Low-to-High transition delay ($tp_{LH}$), whose characteristics are for example are shown with nodes N4 and N3, respectively, in the signal diagram of FIG. 3. Unlike the prior art, deadtime generator 100 comprises an asymmetric arrangement with only a single feedback loop through inverter inv4.

Figure 3:
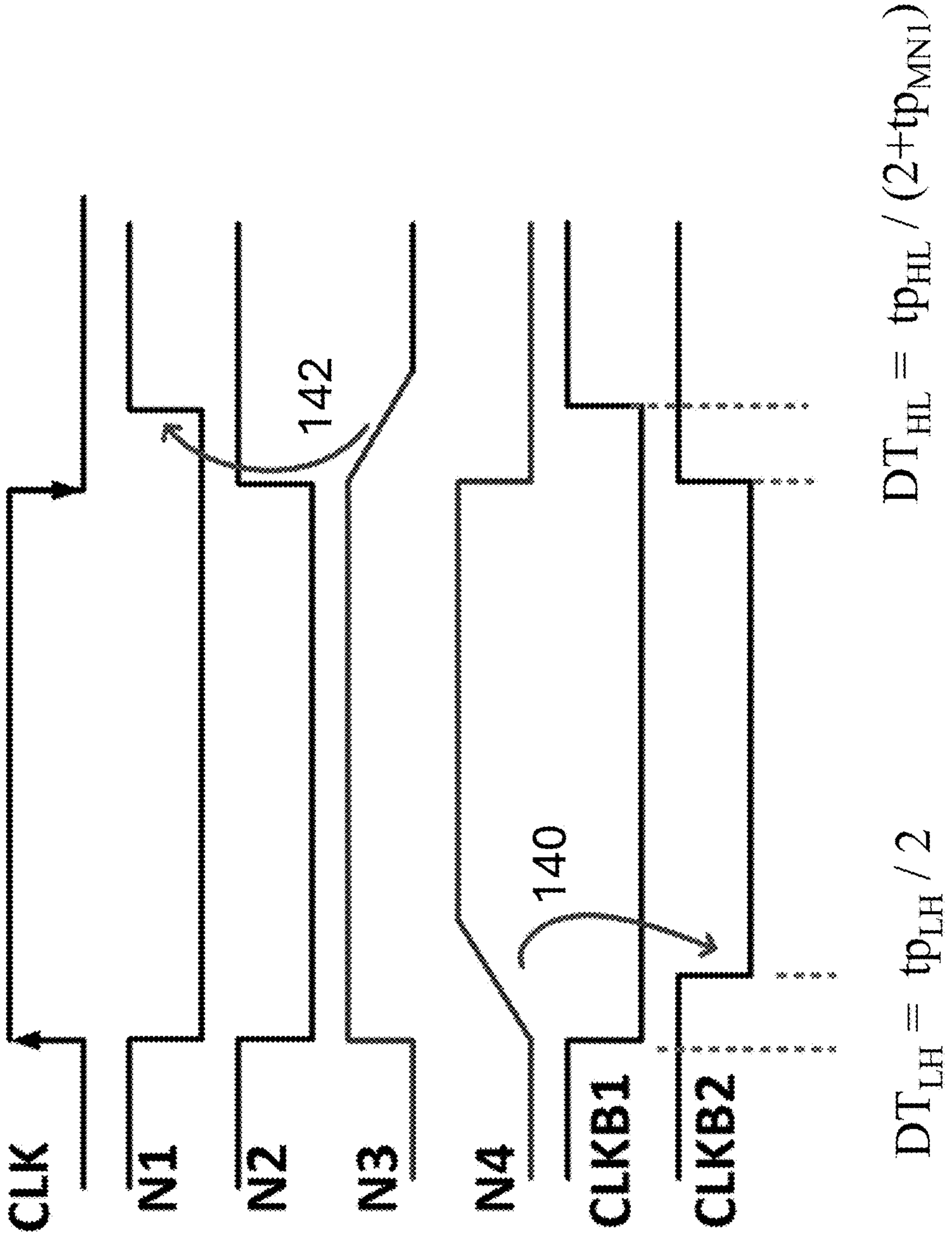
FIG. 3 shows a signal diagram of the deadtime generator of FIG. 2, according to embodiments of the disclosure.

Operation of the deadtime generator 100 is as follows, with reference to the signal diagram of FIG. 3. During a Low-to-High transition of CLK, node N1 (as well as CLKB1) transitions to Low. Similarly, node N2 transitions to Low. However, because inv5 has an increased Low-to-High transition delay ($tp_{LH}$), CLKB2's transition to low is delayed relative to CLBK1. In this example, the Low-to-High delay time $DT_{LH}=tp_{LH}/2$.

Additionally, during a Low-to-High transition of CLK, decoder logic 108 will pass a High signal to the gate(s) of MN1, which will cause the output of MN1 to discharge to ground (i.e., resulting in a strong zero signal at N3). The strength of the zero signal may be determined by a number of transistors utilized from the set of transistors MN1 implemented by decoder logic 108, such that the fewer transistors used, the longer the delay. The delay associated with MN1 is referred to herein as $tp_{MN1}$.

During a High-to-Low transition of CLK, node N2 (as well as CLKB2) transitions to High along the second signal path 122. During the High-to-Low transition of CLK, the output of inv1 goes from Low-to-High in the first signal path 120. However, because there is a strong zero (i.e., Low) at node N3, node N3 cannot go from Low-to-High, i.e., it depends on the state of MN1. At the feedback signal path 124, the output of inv3 goes from Low-to-High and the output of inv4 transitions to Low with a delay ($tp_{HL}$), which causes feedback node N3's transition from High-to-Low to skew and delay's N3's transition from Low-to-High. MN1 will hold N3 at logic Low at for a delay time ($tp_{HL}$). This in turn results in the Low-to-High transition of CLKB1 being delayed relative to CLKB2. The High-to-Low delay time $DT_{HL}=tp_{HL}/(2+tp_{MN1})$.

Due to the extra discharge path at node N1 (due to MN1), N1 will have a longer logic Low state. This will increase the duty ratio for CLKB1. On the other hand, skewed propagation delay for logic Low-to-High of inv5 delays the High-to-Low transition of CLKB2, but not the Low-to-High transition. This will reduce the duty ratio at CLKB2. As can be seen in FIG. 3, the Low-to-High skewed inverter inv5 (node N4) causes a delayed transition ($DT_{LH}$) in the second modified clock signal CLKB2 relative to a Low-to-High transition in the input clock signal CLK, as shown by arrow 140. Additionally, the High-to-Low skewed inverter inv4 (N3) causes a delayed transition ($DT_{HL}$) in the first modified clock signal CLKB2 relative to a High-to-Low transition in the input clock signal CLK, as shown by arrow 142. Note the circuit requires implementing inv4, inv5 and MN1 such that: $tp_{HL}+t_{N1}\approx tp_{LH}$, where $t_{N1}$ is the delay at N1.

Deadtime generator 100 can accordingly be tuned to provide a wide range of deadtime delays, e.g., by using decoder logic to select more than one transistor MN1, by implementing transistors of different sizes with defined delay characteristic, and/or by implementing skewed inverters inv4 and inv5 with different defined delay characteristics.

Figure 4:
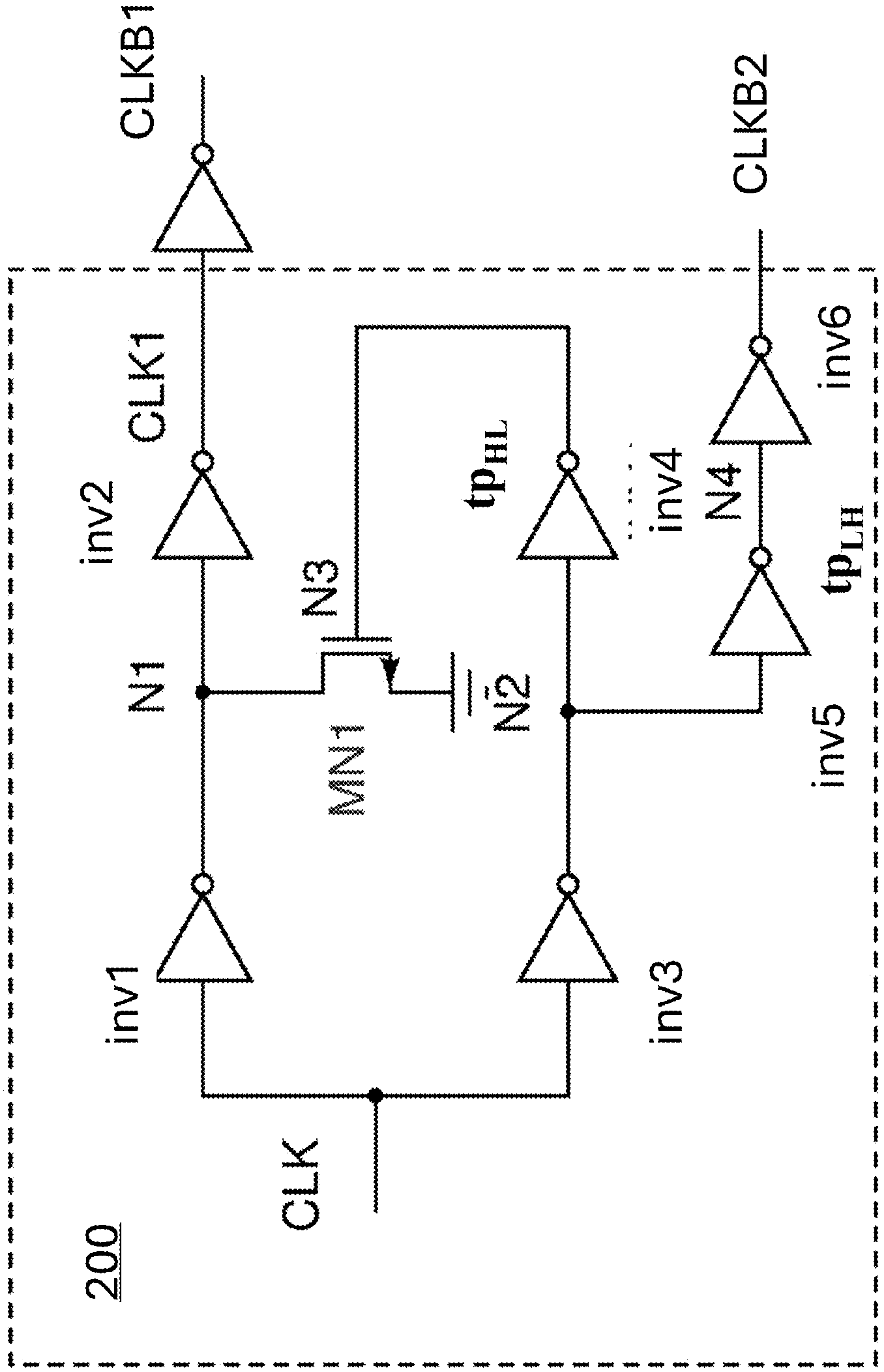
FIG. 4 shows an alternative deadtime generator configuration, according to embodiments of the disclosure.

FIG. 4 depicts an alternative arrangement of a deadtime generator 200. In this illustrative embodiment, deadtime generator 200 similarly provides non-overlapping clock signals CLKB1 and CLKB2 in response to an inputted clock signal CLK. Similar to the embodiment described in FIG. 2, deadtime generator 200 includes four identical and standard inverters inv1, inv3, inv2 and inv6, and two skewed inverters inv4 and inv5. Skewed inverter inv4 has an increased High-to-Low transition delay ($tp_{HL}$) and skewed inverted inv5 has an increased Low-to-High transition delay ($tp_{LH}$). Note that in this embodiment, MN1 is implemented with a single transistor MN1 and accordingly does not require any decoder logic. Otherwise, deadtime generator 200 operates in the same manner as the circuit described in FIG. 2.

The described approaches accordingly provide a deadtime generator that can operate with lower power and consume lower area on a chip relative to prior approaches. The described circuits also allow for shortened deadtime delays of 20-40 picoseconds (i.e., a single transistor delay), and thus higher frequencies.

The terminology used herein is for the purpose of describing particular embodiments only and is not intended to be limiting of the disclosure. As used herein, reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed. It will be further understood that the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

"Optional" or "optionally" means that the subsequently described event or circumstance may or may not occur, and that the description includes instances where the event occurs and instances where it does not. It will be further understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A circuit, comprising:

an input node connected to receive a clock signal;

a first signal path coupled to the input node and having a first output node for outputting a first modified clock signal, wherein the first signal path includes a feedback node coupled to an input of a feedback inverter;

a second signal path coupled to the input node and having a second output node for outputting a second modified clock signal, wherein second signal path includes a Low-to-High skewed inverter; and a feedback signal path coupled to the second signal path and having a High-to-Low skewed inverter with an output coupled to a gate of at least one transistor, wherein an output of the at least one transistor is coupled to the feedback node wherein the first signal path includes:

a first inverter having an input coupled to the input node and an output coupled to an input of the feedback inverter; and a second inverter having an input coupled to an output of the feedback inverter and an output coupled to the first output node.

2. The circuit of claim 1, wherein the second signal path includes:

a third inverter having an input coupled to the input node and an output coupled to an input of the Low-to-High skewed inverter; and a fourth inverter having an input coupled to an output of the Low-to-High skewed inverter and an output coupled to the second output node.

3. The circuit of claim 2, wherein the at least one transistor comprises an n-type metal-oxide-semiconductor (NMOS) transistor that couples a ground signal to the feedback node in response to a logic high at the gate.

4. The circuit of claim 2, wherein the feedback signal path includes:

decoder logic coupled to an output of the High-to-Low skewed inverter; and the at least one transistor includes a set of transistors, each configured to couple a ground signal to the feedback node.

5. The circuit of claim 4, wherein the decoder logic is configured to utilize a selected number of the set of transistors.

6. The circuit of claim 1, wherein the Low-to-High skewed inverter causes a delayed transition ($DT_{LH}$) in the second modified clock signal relative to a Low-to-High transition in the input clock signal.

7. The circuit of claim 6, wherein the delayed transition ($DT_{LH}$) is given as:

$$DT_{LH}=tp_{LH}/2$$

where $tp_{LH}$ is the transition delay caused by the Low-to-High skewed inverter.

8. The circuit of claim 1, wherein the High-to-Low skewed inverter causes a delayed transition ($DT_{HL}$) in the first modified clock signal relative to a High-to-Low transition in the input clock signal.

9. The circuit of claim 6, wherein the delayed transition ($DT_{LH}$) is given as:

$$DT_{HL}=tp_{HL}/(2+tp_{MN1})$$

where $tp_{HL}$ is the transition delay and $tp_{MN1}$ is the delay caused by the at least one transistor.

10. A system, comprising:

a clock driven component; and a deadtime generator that includes:

an input node connected to receive a clock signal;

a first signal path coupled to the input node and having a first output node for outputting a first modified clock signal to the clock driven component, wherein the first signal path includes a feedback node coupled to an input of a feedback inverter;

a second signal path coupled to the input node and having a second output node for outputting a second modified clock signal to the clock driven component, wherein the second signal path includes a Low-to-High skewed inverter; and a feedback signal path coupled to second signal path and having a High-to-Low skewed inverter with an output coupled to a gate of at least one transistor, wherein an output of the at least one transistor is coupled to the feedback node wherein the first signal path includes:
- a first inverter having an input coupled to the input node and an output coupled to an input of the feedback inverter; and
- a second inverter having an input coupled to an output of the feedback inverter and an output coupled to the first output node.

11. The system of claim 10, wherein the second signal path includes:
- a third inverter having an input coupled to the input node and an output coupled to an input of the Low-to-High skewed inverter; and
- a fourth inverter having an input coupled to an output of the Low-to-High skewed inverter and an output coupled to the second output node.

12. The system of claim 11, wherein the at least one transistor comprises an n-type metal-oxide-semiconductor (NMOS) transistor that couples a ground signal to the feedback node in response to a logic high at the gate.

13. The system of claim 11, wherein the feedback signal path includes:
- decoder logic coupled to an output of the High-to-Low skewed inverter;
- the at least one transistor includes a set of transistors, each configured to couple a ground signal to the feedback node; and
- wherein the decoder logic is configured to utilize a selected number of transistors from the set of transistors.

14. The system claim 10, wherein the Low-to-High skewed inverter causes a delayed transition ($DT_{LH}$) in the second modified clock signal relative to a Low-to-High transition in the input clock signal.

15. The system of claim 10, wherein the High-to-Low skewed inverter causes a delayed transition ($DT_{HL}$) in the first modified clock signal relative to a High-to-Low transition in the input clock signal.

16. The system of claim 10, wherein the clock driven component comprises an amplifier power.

17. The system of claim 10, wherein the clock driven component comprises a charge pump.

18. The system of claim 10, wherein comprising an integrated circuit that implements the clock driven component and deadtime generator.

* * * * *